United States Patent Office 3,697,274
Patented Oct. 10, 1972

3,697,274

MATERIAL AND PROCESS FOR THE PREPARATION OF PRINTING PLATES

Heinz Herrmann, Wiesbaden-Biebrich, Germany, assignor to Kalle Aktiengesellschaft, Wiesbaden-Biebrich, Germany No Drawing. Continuation of application Ser. No. 500,486, Oct. 14, 1965. This application Sept. 16, 1969, Ser. No. 860,161
Claims priority, application Germany, Oct. 15, 1964, K 54,270
Int. Cl. G03f 7/02
U.S. Cl. 96—36.3 5 Claims

ABSTRACT OF THE DISCLOSURE

This invention relates to a presensitized printing plate comprising a base material having a coating thereon comprising a solvent-soluble, acid-curable amine-formaldehyde resin and a light-sensitive organic halogen compound in which chlorine, bromine, or iodine is attached to carbon.

This application is a continuation of application Ser. No. 500,486, filed Oct. 14, 1965, now abandoned.

The invention relates to a new material and a new process for the preparation of printing plates. It is known to use for this purpose copying coatings which contain, as light-sensitive material, gelatin mixed with bichromate. Instead of bichromate, diazo and azido compounds have been used and coatings which contain diazo compounds and are free from colloids also have been used. Also known are copying coatings containing unsaturated compounds which polymerize in the presence of light. A further group comprises coatings having different electrical conductivity in the dark and in the light with which printing plates, e.g., electrophotographic printing plates, also have been prepared.

Now it has been found that coatings which contain an acid-curable resin and an organic halogen compound, with the halogen attached to carbon, are also suitable as copying coatings for the preparation of printing plates and exhibit remarkable advantages when used for this purpose.

Thus, the invention is a material for use in the preparation of printing plates, in which material there is a light-sensitive coating on a coating support, which coating contains an acid-curable resin and an organic halogen compound in which chlorine, bromine or iodine is attached to carbon.

The process by which a printing plate is prepared from the material is also part of the invention. In the process, the copying coating of the aforementioned material is exposed through an original or master to short-wave radiation and the unexposed parts of the coating are removed with a solvent. It is necessary in most cases, and generally of advantage, to heat the layer before applying the solvent.

The organic halogen compounds to be used in the invention, which should contain the halogen attached to a carbon atom, may be aliphatic or isocyclic or heterocyclic carbon compounds. Among the many known organic halogen compounds, those have proved advantageous which contain several halogen atoms attached to one and the same carbon atom or to one and the same aromatic or isocyclic ring. Very good results were achieved, for example, with carbon tetrabromide, hexabromoethane, bromoform and iodoform. The halogen compound to be used also may be a macromolecular compound, for example a resin, which is formed by the condensation of tribromoacetaldehyde with pyrene by heating the reactants in the presence of acid catalysts.

For the preparation of the copying coating, resins are suitable which are soluble in solvents and which, as a result of additions of small amounts of acid, are capable of being converted into products which are only difficultly soluble, or are insoluble, in the solvents in which they previously were soluble. Such resins are, for example, the condensates of formaldehyde with urea or with melamine.

In order to prepare the photomechanical copying coatings, the soluble acid-curable resin to be used is dissolved, together with the light-sensitive halogen compound to be used, in a suitable solvent and the solution is applied to a coating support. The coating is then dried at a temperature below 40° C. The nature of the solvent to be used is determined by the resin used and the halogen compound used, both of which should be soluble in the solvent. In most cases, alcohols, such as methanol, ethanol, propanols, butanols and amyl alcohols; ketones, such as acetone or methyl-butyl-ketone; esters such as acetic acid ethyl ester or acetic acid amyl ester; and also hydrocarbons or halogenated hydrocarbons, can be used as solvents. Mixtures of the compounds also can be employed as solvents. The solvent preferably is not too difficultly volatile, so that at a temperature of 40° C. it volatilizes practically completely, in one hour, from filter paper onto which it has been dripped. The proportion by weight of halogen compound to curable resin may vary within wide limits; preferably, it is between 1:20 and 5:1.

The coating may contain other constituents in addition to the halogen-containing compound and the soluble, curable resin. Thus, it may contain, for example, stabilizing agents for the prevention of decomposition of the halogen compound in the dark, or sensitizers for the better utilization of the light absorbed during later exposure, or fixing agents which prevent volatilization of the halogen-containing compound. In addition, for improving the mechanical properties of the copying coating, binding agents other than a curable resin or fillers, may be present in the coating. The inclusion of a filler is often desirable when the curable resin employed is sticky. As fillers, inorganic substances, e.g. colloidal silicic acid, talc, barite and other delustering agents, or organic substances, e.g. starch powder, are useful. The fillers are so selected that they do not retard the hardening reaction caused by exposure and heating and do not adversely affect the development of the coating into a printing image. Some fillers, e.g. colloidal silicic acid, promote the hardening of the coating. Insoluble fillers are suspended in the coating solution, if necessary after grinding to a suspendable powder.

As coating supports, bases known in printing are suitable, e.g. paper, in particular water-impermeable papers provided with a hydrophilic precoat, also plastic foils, as well as metallic supports such as aluminum foils or zinc plates.

In order to convert the light-sensitive material of the invention into a printing plate, the copying coating is exposed under an original to a light source which emits shortwave light at a wavelength below 4000 A., e.g. a carbon arc lamp or a mercury vapor lamp. In most cases, the material should then briefly be heated in a drying cabinet or under an infrared radiator to a temperature between 60 and 160° C. for two minutes or less. In exceptional cases, e.g. when thick metallic printing plates are used, the temperature applied may be higher or the time of heating longer, or both. However, the temperature should not exceed 200° C. and heating should not be extended over 4 minutes. The material, still warm or cooled to room temperature, is then decoated by wiping over with a solvent for the soluble resin used. In this way, a negative image of the original is obtained which can be processed in conventional manner into a printing plate. A planographic printing plate is obtained by inking up with greasy ink, or a letterpress printing plate by etching. Sometimes, it is advantageous to further harden the resin image by heating it to a higher temperature, e.g. 160 to 220° C., before processing.

The copying coating of the invention is distinguished from the conventional light-sensitive colloid coatings or tanning diazo coatings by greater light-sensitivity. Compared with electrophotographic coatings, they have the advantage that they can be more easily processed into printing plates. Compared with coatings capable of being polymerized by light, they also have the advantage of increased light-sensitivity.

The invention will be further illustrated by the following examples in which 1 ml. is the unit of volume and 1 g. is the unit of weight.

EXAMPLE 1

60 parts by weight of $CBr_4$ are dissolved in 800 parts by volume of acetone. To this solution, 100 parts by volume of Beckurol 720 (60% by weight solution of an acid-curable, plasticized urea resin in an organic solvent) and 8 parts by weight of colloidal silicic acid are added and the mixture is ground for 12 hours in a ball mill.

After grinding, an additional 200 parts by volume of acetone are added and the suspension is whirl-coated onto an aluminum foil previously roughened by brushing. The coating is then dried in a cold air stream and a light-sensitive presensitized printing plate is obtained. For processing into a printing plate, it is exposed for 25 seconds under a negative film original to an 18 amp. carbon arc lamp at a distance of 65 cm. The exposed plate is then heated for 60 seconds in a drying cabinet at a temperature of 130° C. and, with the aid of pads of cotton, wiped over with acetone, then with a 20% by weight aqueous solution of sodium metasilicate, then with greasy ink and then with a conventional preserving solution. The plate is then heated to 180° C. for two minutes, in order to further harden the resin, and is then ready for use in the offset printing process.

EXAMPLE 2

20 parts by volume of the 60% urea resin solution described in Example 1, 10 parts by weight of a novolak resin having a melting point of 108–118° C. (Alnovol 429K) and 20 parts by weight of $CBr_4$ are dissolved in 150 parts by volume of acetone. The solution is whirl-coated onto an aluminum foil and dried at 40° C.

In order to process the presensitized printing plate thus obtained, it is exposed under a negative film original for 30 seconds to an 18-ampere carbon arc lamp at a distance of 65 cm. The coating is heated for one minute at 140° C., decoated according to the procedure of Example 1 and converted into a planographic printing plate.

EXAMPLE 3

5 parts by weight of $CBr_4$, 2.5 parts by weight of polystyrene and 5 parts by volume of a 60% by weight solution of an acid-curable urea resin (Beckurol 720) are dissolved in 100 parts by volume of toluene. The solution is whirl-coated onto an aluminum foil and dried.

In order to prepare a printing plate from the presensitized printing plate thus obtained, exposure is effected as described in Example 1. After exposure, the coating is heated to 150° C. for two minutes and then wiped over with acetone; the unexposed areas are removed. The plate is then treated with 20% sodium metasilicate solution, then inked up with greasy ink and preserved in conventional manner. In order to achieve long printing runs, the plate is heated to 180° C. for an additional two minutes.

EXAMPLE 4

One part by weight of iodoform is dissolved in 90 parts by volume of toluene and 10 parts by volume of a 55 percent solution of an acid-curable melamine-formaldehyde resin (Maprenal SHL) in butanol are added to the solution. The solution thus obtained is whirl-coated onto an aluminum foil roughened by brushing and the foil is then dried by means of warm air. The light-sensitive layer thus produced is then exposed for 1 minute in contact with a negative film original to an 18-amp. carbon arc lamp at a distance of 65 cm. The plate is then heated for 30 seconds at 150° C. and wiped over with alcohol to remove the unexposed parts of the coating from the support. The hydrophilic property of the bared areas is improved by wiping over with dilute phosphoric acid. After inking with greasy ink, the planographic plate thus obtained is ready for printing.

EXAMPLE 5

The procedure described in Example 4 is repeated, using, however, the same quantity of 9,10-dibromoanthracene instead of iodoform.

EXAMPLE 6

One part by weight of 2,5-dimethyl-ω-tribromo-acetophenone is dissolved in 100 parts by volume of toluene and to the solution thus obtained the following solutions are added, one after the other:

5 parts by volume of a 60 percent solution of an unplasticized urea-formaldehyde resin (Beckamin 801) in butanol, 5 parts by volume of a 50 percent solution of a styrenized alkyd resin (Alkydal V15) in toluene, and 5 parts by volume of a 65 percent solution of a fatty-acid-modified curable phenol-formaldehyde resin of the resole type (Durophen 218V) in xylene.

An aluminum foil is coated with this mixture and then processed into a planographic printing plate as described in Example 4.

EXAMPLE 7

5 parts by volume of the urea resin solution mentioned in Example 1, 10 parts by weight of polystyrene with an average molecular weight of 75,000, and 2.5 parts by weight of a resin details of which are given below are dissolved in 150 parts by volume of toluene. The resin used is obtained by condensing pyrene with formaldehyde in the presence of hydrochloric acid; it has a chlorine content of 2.6 percent by weight. An aluminum foil is coated with the solution thus prepared and dried. The layer thus produced on the aluminum foil is exposed for 30 seconds under a film original to a 125 watt mercury vapor lamp at a distance of 40 cm. and then heated for 20 seconds to 150° C., whereupon the unexposed areas of the layer are removed by wiping over with a cotton pad moistened with alcohol. The plate is further heated for 3 minutes to 180° C., made hydrophilic by means of dilute phosphoric acid, and then inked up with greasy ink.

EXAMPLE 8

The following solutions are dissolved in 150 parts by volume of toluene:

5 parts by volume of the urea-formaldehyde resin solution mentioned in Example 1, 20 parts by volume of a 50 percent solution of a styrenized alkyd resin (Alkydal V15) in toluene, and 2 parts by weight of the chlorine-containing pyrene-formaldehyde resin mentioned in Example 7.

The solution is coated onto an aluminum foil and the coating is dried. The layer thus produced is exposed in a photoprinting apparatus in contact with a negative film original, then heated for 20 seconds to 150° C., and finally wiper over with alcohol. A positive resin image is thus obtained which is further hardened by heating for 2 minutes to 150° C., and the bared areas of the aluminum support are then made more strongly hydrophilic by treating the whole surface with dilute phosphoric acid. The plate is then inked up with greasy ink, a good printing plate for offset-printing being the result.

EXAMPLE 9

To a solution of 1 part by weight of iodoform in 100 parts by volume of toluene there are added approximately 10 parts by volume of a 55 percent by weight solution of a curable melamine-formaldehyde resin (Maprenal SGA) in alcohol, and an aluminum foil roughened by brushing is coated with the solution thus obtained. The coated foil is exposed, heated, developed and processed into an offset printing plate as described in Example 4.

EXAMPLE 10

The procedure described in Example 9 is repeated using, however, as the resin solution, 10 parts by volume of a 70 percent by weight solution of an unplasticized urea-formaldehyde resin in butanol and xylene (Plastopal EBS).

EXAMPLE 11

The procedure described in Example 9 is repeated using, however, as the resin solution, 10 parts by volume of a 60 percent by weight solution of a plasticized urea-formaldehyde resin (Plastopal BT) in butanol.

EXAMPLE 12

Five parts by weight of an acid-curable carbazole-formaldehyde condensate obtained by 8½ hours' boiling and agitation of a mixture of 5 parts by weight of carbazole, 15 parts by volume of Formalin (37 percent by weight), 3 parts by volume of concentrated phosphoric acid (84 percent by weight) and 30 parts by volume of benzene are dissolved, with 1 part by weight of iodoform, in 100 parts by volume of toluene. An aluminum foil is coated with this solution. After drying the coated layer, it is exposed as described in Example 4 and the unexposed areas are immediately decoated with a mixture of 3 parts by volume of methyl glycol and 1 part by volume of dilute phosphoric acid (5 percent). The plate is made ready for printing by inking up with greasy ink.

EXAMPLE 13

For further sensibilization, the coating solution described in Example 4 is mixed with 200 mg. of perylene which had been moistened with 20 ml. of chloroform. A layer produced on an aluminum support with the solution thus obtained is exposed for 10 seconds in contact with a negative film original to an 18 amp. carbon arc lamp at a distance of 65 cm. and then converted into a printing plate as described in Example 4.

EXAMPLE 14

The coating solution used in Example 13 is mixed with 0.5 part by volume of a 1 percent solution in alcohol of the polymethine dyestuff Astrazonrot 6B (Colour Index No. 48020), and an aluminum foil is coated with this solution. For conversion into a printing plate, the layer is exposed for three seconds under a negative film original to an 18 amp. carbon arc lamp at a distance of 65 cm. and further treated as described in Example 4.

The layer is also sensitive to the light of an incandescent lamp. If a 200-watt lamp is used for exposure, an exposure time of 30 to 60 seconds will be required.

EXAMPLE 15

Five parts by weight of a polyvinyl acetate having an average molecular weight of 1,000,000 are dissolved in the coating solution described in Example 14. The solution is diluted with 40 parts by volume of toluene, whirl-coated onto an aluminum foil, and then dried by means of hot air. For the preparation of a planographic printing plate, the coated foil is treated as described in Example 13.

EXAMPLE 16

A bromine-containing resin is prepared from tribromoacetaldehyde and pyrene by mixing 25 parts by weight of tribromoacetaldehyde,
21.5 parts by weight of pyrene (commercial quality), and
0.75 part by weight of anhydrous zinc chloride with agitation and heating to 115° C. Condensation (generation of water, foaming) begins before this temperature is reached. The mixture is allowed to react for 8 to 9 minutes and is then cooled. A brown-black, brittle resin is obtained.

For the preparation of a printing plate, the following solutions are mixed:

1 part by weight of the bromine-containing resin above in 30 parts by volume of chlorobenzene,
10 parts by volume of the melamine resin mentioned in Example 4, in 60 parts by volume of toluene, and
12.5 parts by weight of a methacrylic acid ester polymer resin (e.g. Plexigum P24) in 90 parts by volume of toluene, and the solution thus obtained is cast onto an aluminum sheet roughened by brushing and dried by means of hot air. The layer thus produced is exposed for 90 seconds under a negative film original to an 18 amp. carbon arc lamp at a distance of 65 cm., heated for 30 seconds in a drying cabinet at 150° C., and the unexposed areas are then removed with alcohol. After the plate has been made hydrophilic by means of a sodium metasilicate solution and inked up with greasy ink, it may be used for printing.

EXAMPLE 17

10 parts by volume of the melamine resin mentioned in Example 4, 4 parts by weight of tetrabromo pyrrole, and 2 parts by weight of polystyrene with an average molecular weight of 75,000 are dissolved in 170 parts by volume of toluene.

A layer of this solution applied to aluminum is exposed for 2 minutes under a negative film original to an 18 amp. carbon arc lamp at a distance of 65 cm. and then converted into a printing plate as described in Example 16.

EXAMPLE 18

An eloxated aluminum foil is coated with a solution consisting of:

10 parts by volume of the melamine resin mentioned in Example 4,
1 part by weight of iodoform,
0.2 part by weight of perylene (moistened with a small quantity of chloroform), and
0.005 part by weight of Astrazonrot 6B (Color Index No. 48020) in
100 parts by volume of toluene.

After drying, the coated plate is exposed for 5 seconds in contact with a negative film original to an 18 amp. carbon arc lamp at a distance of 65 cm., heated for 30 seconds to 150° C., and the unexposed areas are then removed with alcohol. After wiping over with a sodium metasilicate solution and inking with greasy ink, the plate may be used for printing.

EXAMPLE 19

A commercial paper printing foil for direct inscription is coated with a solution of 10 parts by weight of the carbazoleformaldehyde resin mentioned in Example 12 and 1 part by weight of iodoform in 100 parts by volume of toluene.

After drying with warm air, the layer is exposed as described in Example 4 and the unexposed areas of the image are then removes with a mixture of equal parts by volume of acetone, isopropanol and water with some sodium metasilicate added. After inking with greasy ink, the plate may be used for offset printing.

EXAMPLE 20

A zinc plate which had been superficially roughened by etching with dilute nitric acid is coated with the following solution:

40 parts by volume of acetone,
10 parts by volume of toluene,
10 parts by volume of the melamine resin mentioned in Example 4,
5 parts by weight of an alcohol-soluble phenol-formaldehyde resin having a melting range of 108–118° C. (Alnovol 429K),
1 part by weight of iodoform.
0.2 part by weight of perylene, and
0.005 part by weight of Astrazonrot 6B (Color Index No. 48020).

For conversion into a printing plate, the coated plate is exposed for 10 seconds in contact with a negative film original to an 18 amp. carbon arc lamp at a distance of 60 cm., heated for two and a half minutes in a drying cabinet at 160° C., then wiped over with a cotton pad soaked in alcohol, so that the unexposed areas of the layer are removed, and finally etched with a 7.5 percent solution of nitric acid.

It will be obvious to those skilled in the art that many modifications may be made within the scope of the present invention without departing from the spirit thereof, and the invention includes all such modifications.

What is claimed is:

1. A process for making a printing plate which comprises exposing a supported sensitized layer to light under a master, heating the layer to a temperature in the range of about 60 to 200° C. for not more than four minutes, and then decoating the unexposed portions thereof, the sensitized layer comprising a solvent-soluble, acid-curable resin selected from the group consisting of urea-formaldehyde and melamine-formaldehyde resins, a light-sensitive organic halogen compound in which a halogen selected from the group consisting of chlorine, bromine and iodine is attached to carbon, and a sensitizer.

2. A process according to claim 1 in which the decoated layer is heated to a temperature in the range of about 160 to 220° C.

3. A process according to claim 1 in which the layer is heated to 60 to 160° C. for not more than two minutes before decoating.

4. A process according to claim 1 in which the sensitizer is perylene.

5. A process according to claim 1 in which the sensitizer is polymethine dyestuff.

References Cited

UNITED STATES PATENTS

| | | | |
|---|---|---|---|
| 3,346,384 | 10/1967 | Gaynor | 96—90 X |
| 3,503,745 | 3/1970 | Yamada et al. | 96—90 |
| 1,587,272 | 6/1926 | Beebe et al. | 96—33 X |
| 1,655,127 | 1/1928 | Beebe | 96—36.3 X |
| 3,231,377 | 1/1966 | Dickinson et al. | 96—33 |
| 2,827,390 | 3/1958 | Garrigus | 96—36 X |

OTHER REFERENCES

"Modern Plastics Encyclopedia for 1963," September 1962, vol. 40, No. 1A, pp. 150–151.

"Kodak Industrial Data Book P–7," 1962, p. 32.

GEORGE F. LESMES, Primary Examiner

R. E. MARTIN, Assistant Examiner

U.S. Cl. X.R.

96—33, 35.1, 48, 90 R, 115 R; 101—456, 457, 458, 462, 459, 463